(12) United States Patent
Oshita

(10) Patent No.: US 12,040,824 B2
(45) Date of Patent: Jul. 16, 2024

(54) RADIO FREQUENCY MODULE AND COMMUNICATION DEVICE

(71) Applicant: Murata Manufacturing Co., Ltd., Nagaokakyo (JP)

(72) Inventor: Teruaki Oshita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 345 days.

(21) Appl. No.: 17/536,114

(22) Filed: Nov. 29, 2021

(65) Prior Publication Data

US 2022/0085836 A1 Mar. 17, 2022

Related U.S. Application Data

(63) Continuation of application No. PCT/JP2020/025389, filed on Jun. 26, 2020.

(30) Foreign Application Priority Data

Jul. 9, 2019 (JP) ................................. 2019-127755

(51) Int. Cl.
*H04B 1/04* (2006.01)
*H03H 7/38* (2006.01)
*H04B 1/18* (2006.01)

(52) U.S. Cl.
CPC .............. *H04B 1/0458* (2013.01); *H03H 7/38* (2013.01); *H04B 1/18* (2013.01); *H04B 2001/0408* (2013.01)

(58) Field of Classification Search
CPC .......... H03H 7/38; H04B 1/00; H04B 1/0458; H04B 1/18; H04B 2001/0408; H05K 1/18

(Continued)

(56) References Cited

U.S. PATENT DOCUMENTS

2021/0143780 A1* 5/2021 Kita .......................... H03H 7/38
2021/0219419 A1* 7/2021 Takematsu ............... H03H 9/70

(Continued)

FOREIGN PATENT DOCUMENTS

| JP | 2005-223582 A | 8/2005 |
|---|---|---|
| WO | 2018/168500 A1 | 9/2018 |

OTHER PUBLICATIONS

English translation of the Written Opinion mailed on Sep. 29, 2020, received for PCT Application PCT/JP2020/025389.

(Continued)

*Primary Examiner* — Tan H Trinh
(74) *Attorney, Agent, or Firm* — XSENSUS LLP

(57) ABSTRACT

Loss caused by wiring is reduced. A radio frequency module includes a mounting board, a low-noise amplifier, and an input matching circuit. The mounting board has a first principal surface and a second principal surface. The first principal surface and the second principal surface are on opposite sides of the mounting board. The low-noise amplifier amplifies a reception signal (first reception signal). The input matching circuit includes an inductor. The inductor is connected to the input side of the low-noise amplifier. The inductor is arranged on the first principal surface side of the mounting board. The low-noise amplifier is arranged on the second principal surface side of the mounting board. In a plan view seen from a thickness direction of the mounting board, at least part of the inductor overlaps with at least part of the low-noise amplifier.

20 Claims, 2 Drawing Sheets

(58) Field of Classification Search
USPC .......................................... 455/522.1, 114.3
See application file for complete search history.

(56) References Cited

U.S. PATENT DOCUMENTS

| | | | |
|---|---|---|---|
| 2022/0102296 A1* | 3/2022 | Kitajima | H05K 1/18 |
| 2022/0116061 A1* | 4/2022 | Takahashi | H04B 1/03 |
| 2023/0268944 A1* | 8/2023 | Uejima | H04B 1/40 |
| | | | 455/114.3 |

OTHER PUBLICATIONS

International Search Report and Written Opinion mailed on Sep. 29, 2020, received for PCT Application PCT/JP2020/025389, Filed on Jun. 26, 2020, 8 pages including English Translation.

* cited by examiner

RADIO FREQUENCY MODULE AND COMMUNICATION DEVICE

CROSS-REFERENCE TO RELATED APPLICATIONS

The present application is a continuation of and claims priority to PCT/JP2020/025389, filed Jun. 26, 2020, which claims priority to JP 2019-127755, filed Jul. 9, 2019, the entire contents of each are incorporated herein by its reference.

BACKGROUND

1. Field of the Disclosure

The present disclosure generally relates to radio frequency modules and communication devices, and more specifically, to a radio frequency module including a low-noise amplifier and a communication device including the radio frequency module.

2. Description of the Related Art

In general, a radio frequency module including a low-noise amplifier is known (for example, see Japanese Unexamined Patent Application Publication No. 2005-223582 (patent document 1)).

The radio frequency module described in the patent document 1 includes a multilayer substrate, a low-noise amplifier, and a reception matching circuit (input matching circuit). The reception matching circuit is electrically connected to the input side of the low-noise amplifier and is made up of two passive elements. In the multilayer substrate, the reception matching circuit is arranged on the same layer (principal surface) with the low-noise amplifier.

SUMMARY

However, in the existing radio frequency module described in the patent document 1, the low-noise amplifier and an inductor, which is a passive element, are arranged on the same principal surface. This necessitates a certain wiring length for connecting the low-noise amplifier and the inductor. Because of this, in the case where the distance between the low-noise amplifier and the inductor becomes longer, there is an issue of loss caused by the wiring between the low-noise amplifier and the inductor.

The present disclosure is made in view of the foregoing points, and an object of the present disclosure is to provide a radio frequency module and a communication device, each of which enables to reduce the loss caused by the wiring.

A radio frequency module according to one aspect of the present disclosure includes a mounting board, a low-noise amplifier, and an input matching circuit. The mounting board has a first principal surface and a second principal surface, and the first principal surface and the second principal surface are on opposite sides of the mounting board. The low-noise amplifier amplifies a reception signal. The input matching circuit includes an inductor connected to the input side of the low-noise amplifier. The inductor is arranged on the first principal surface side of the mounting board. The low-noise amplifier is arranged on the second principal surface side of the mounting board. In a plan view seen from a thickness direction of the mounting board, at least part of the inductor overlaps with at least part of the low-noise amplifier.

A communication device according to one aspect of the present disclosure includes the radio frequency module and a signal processing circuit. The signal processing circuit performs processing on the reception signal.

Other features, elements, characteristics and advantages of the present disclosure will become more apparent from the following detailed description of preferred embodiments of the present disclosure with reference to the attached drawings.

DETAILED DESCRIPTION

Figure 1:
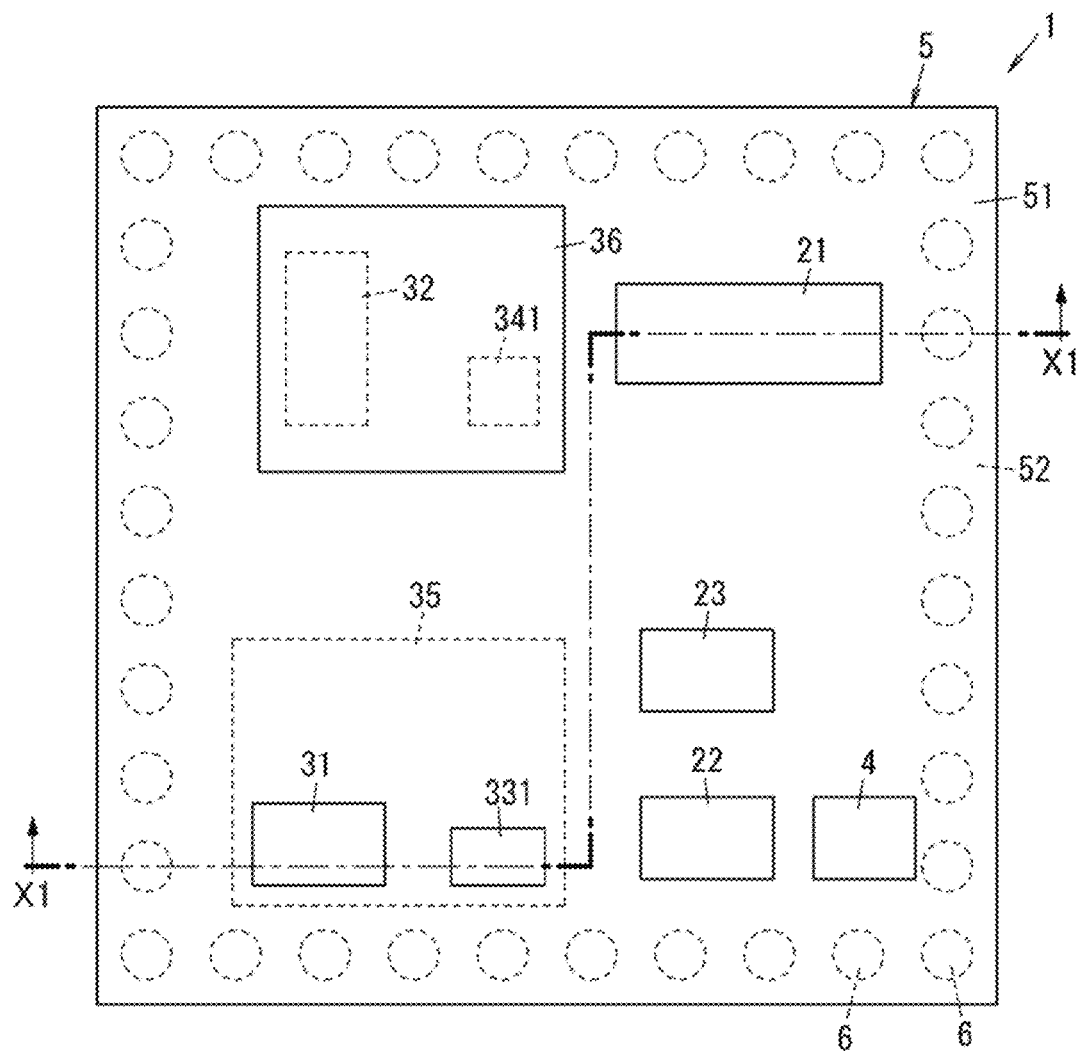
FIG. 1 is a plan view of a radio frequency module according to an embodiment.
Figure 2:
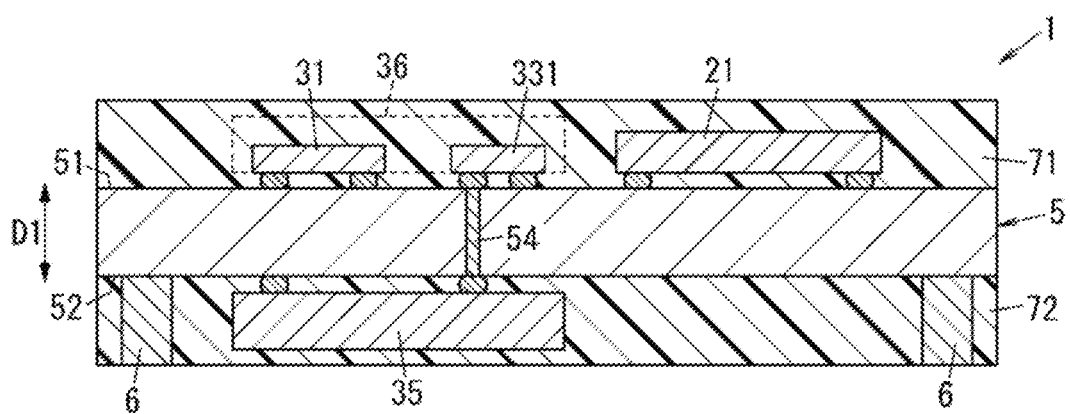
FIG. 2 is a sectional view of the radio frequency module along line X1-X1 of FIG. 1.
Figure 4:
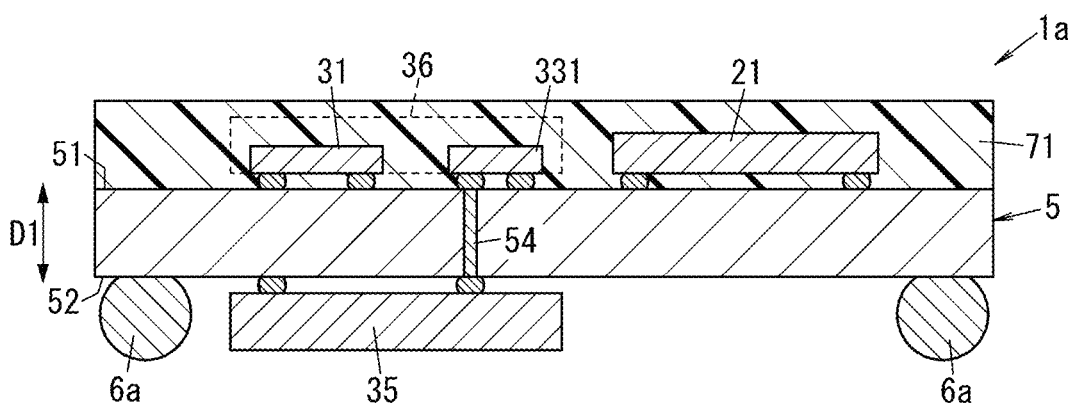
FIG. 4 is a sectional view of a radio frequency module according to a modified example of the embodiment.

Hereinafter, a radio frequency module and a communication device according to an embodiment are described with reference to the drawings. FIG. 1, FIG. 2, and FIG. 4 being referred in the following embodiment and the like are schematic diagrams, and each ratio of sizes or thicknesses of constituent elements in the drawings is not necessarily reflecting the actual ratio of dimensions.

Embodiment

(1) Radio Frequency Module

A configuration of a radio frequency module according to an embodiment is now described with reference to the drawings.

Figure 3:
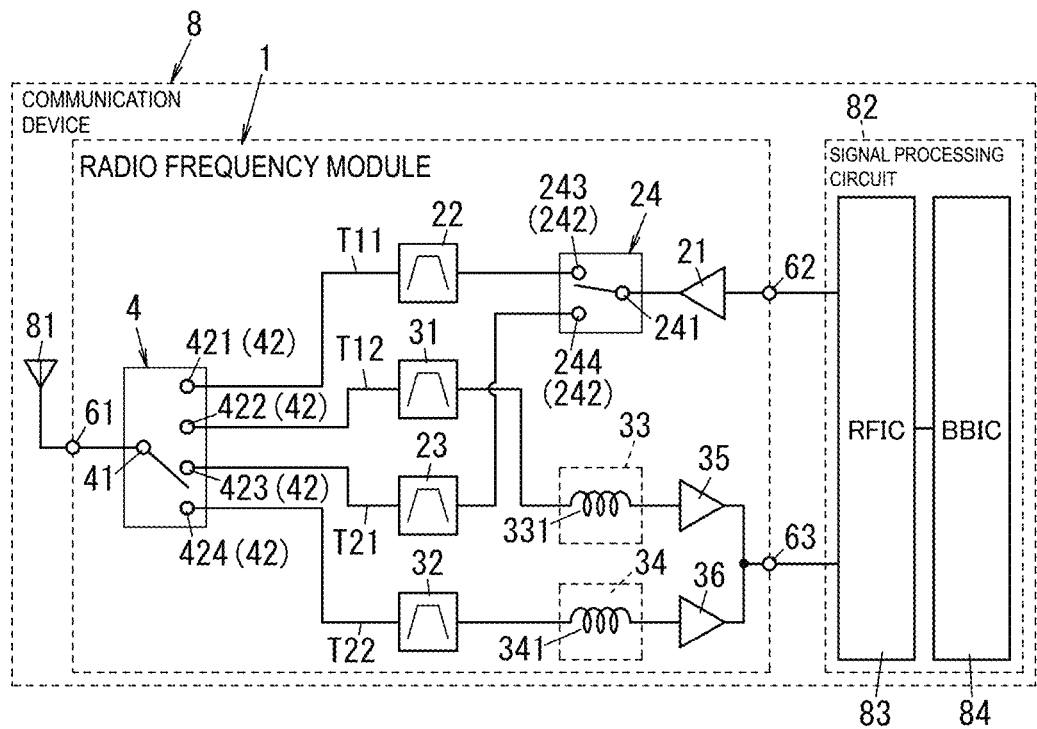
FIG. 3 is a circuit configuration diagram of a communication device according to an embodiment.

As illustrated in FIG. 3, a radio frequency module 1 according to the embodiment includes a power amplifier 21, a first transmission filter 22, a second transmission filter 23, and a switch 24. Further, the radio frequency module 1 includes a first reception filter 31, a second reception filter 32, a first input matching circuit 33, a second input matching circuit 34, a first low-noise amplifier 35, a second low-noise amplifier 36, and an antenna switch 4.

Further, as illustrated in FIG. 1 and FIG. 2, the radio frequency module 1 includes a mounting board 5, a plurality of external connection terminals 6, a first resin member 71, and a second resin member 72.

As illustrated in FIG. 3, the radio frequency module 1 is used, for example, in a communication device 8. The communication device 8 is, for example, a mobile phone such as a smartphone. Note that the communication device 8 is not limited to the mobile phone and, for example, may alternatively be a wearable terminal such as a smart watch or the like.

The radio frequency module 1 performs communication of a first communication band and communication of a second communication band. More specifically, the radio frequency module 1 performs transmission of a transmission signal of the first communication band (hereinafter, referred to as "first transmission signal") and reception of a reception signal of the first communication band (hereinafter, referred to as "first reception signal"). Furthermore, the radio frequency module 1 performs transmission of a transmission signal of the second communication band (hereinafter, referred to as "second transmission signal") and reception of a reception signal of the second communication band (hereinafter, referred to as "second reception signal").

The first transmission signal and the first reception signal are, for example, frequency division duplex (FDD) signals. Note that the first transmission signal and the first reception signal are not limited to the FDD signals and may alternatively be time division duplex (TDD) signals.

The second transmission signal and the second reception signal are, for example, FDD signals. Note that the second transmission signal and the second reception signal are not limited to the FDD signals and may alternatively be TDD signals.

In the radio frequency module 1, communication of the first communication band and communication of the second communication band are performed simultaneously. Examples of simultaneous communications include carrier aggregation (CA) and dual connectivity (DC).

(2) Circuit Configuration of Radio Frequency Module

Next, a circuit configuration of the radio frequency module 1 according to the embodiment is described with reference to FIG. 3. In the following description, it is assumed that the first transmission signal and the first reception signal are FDD signals, and that the second transmission signal and the second reception signal are FDD signals.

(2.1) Power Amplifier

The power amplifier 21 illustrated in FIG. 3 is an amplifier that amplifies the first transmission signal. In a first transmission path T11 that connects a common terminal (antenna terminal) 61 and an input terminal 62, the power amplifier 21 is provided between the input terminal 62 and the first transmission filter 22. Similarly, in a second transmission path T21 that connects the common terminal 61 and the input terminal 62, the power amplifier 21 is provided between the input terminal 62 and the second transmission filter 23. The power amplifier 21 has an input terminal and an output terminal, which are not illustrated. The input terminal of the power amplifier 21 is connected to an external circuit (for example, a signal processing circuit 82) via the input terminal 62. The input terminal 62 is a terminal that receives radio frequency signals (the first transmission signal and the second transmission signal), which are input from the external circuit to the radio frequency module 1. The output terminal of the power amplifier 21 is connected to the switch 24. The power amplifier 21 is controlled, for example, by a controller (not illustrated).

(2.2) First Transmission Filter

The first transmission filter 22 illustrated in FIG. 3 is a transmission filter that allows the first transmission signal to pass. More specifically, the first transmission filter 22 is provided between the switch 24 and the antenna switch 4 in the first transmission path T11. Of the radio frequency signals amplified in the power amplifier 21, the first transmission filter 22 allows a transmission signal in a transmission band of the first communication band, which is the first transmission signal, to pass. The first transmission filter 22 is a transmission filter for the first communication band.

(2.3) Second Transmission Filter

The second transmission filter 23 illustrated in FIG. 3 is a transmission filter that allows the second transmission signal to pass. More specifically, the second transmission filter 23 is provided between the switch 24 and the antenna switch 4 in the second transmission path T21. Of the radio frequency signals amplified in the power amplifier 21, the second transmission filter 23 allows a transmission signal of a transmission band of the second communication band, which is the second transmission signal, to pass. The second transmission filter 23 is a transmission filter for the second communication band.

(2.4) Switch

As illustrated in FIG. 3, the switch 24 has a common terminal 241 and a plurality of selection terminals 242 (two in the illustrated example). The common terminal 241 is connected to the power amplifier 21. Of the plurality of selection terminals 242, a selection terminal 243 is connected to the first transmission filter 22, and a selection terminal 244 is connected to the second transmission filter 23.

The switch 24 switches the connection status between the common terminal 241 and the plurality of selection terminals 242. More specifically, the switch 24 is controlled, for example, by the signal processing circuit 82. The switch 24 electrically connects the common terminal 241 to one of the plurality of selection terminals 242 in accordance with a control signal from a RF signal processing circuit 83 of the signal processing circuit 82.

(2.5) First Reception Filter

The first reception filter 31 illustrated in FIG. 3 is a reception filter that allows the first reception signal to pass. More specifically, in a first reception path T12 that connects the common terminal 61 and an output terminal 63, the first reception filter 31 is provided between the antenna switch 4 and the first input matching circuit 33. Of the radio frequency signals input from the common terminal 61, the first reception filter 31 allows a reception signal of a reception band of the first communication band, which is the first reception signal, to pass. The first reception filter 31 is a reception filter for the first communication band.

(2.6) Second Reception Filter

The second reception filter 32 illustrated in FIG. 3 is a reception filter that allows the second reception signal to pass. More specifically, in a second reception path T22 that connects the common terminal 61 and the output terminal 63, the second reception filter 32 is provided between the antenna switch 4 and the second input matching circuit 34. Of the radio frequency signals input from the common terminal 61, the second reception filter 32 allows a reception signal of a reception band of the second communication band, which is the second reception signal, to pass. The second reception filter 32 is a reception filter for the second communication band.

(2.7) First Input Matching Circuit

The first input matching circuit 33 illustrated in FIG. 3 includes at least a first inductor 331. The first inductor 331 is connected to the input side of the first low-noise amplifier 35. The first input matching circuit 33 is provided between the first reception filter 31 and the first low-noise amplifier 35 in the first reception path T12. The first input matching circuit 33 provides impedance matching between the first reception filter 31 and the first low-noise amplifier 35.

The first inductor 331 may be directly connected in series to the first reception filter 31 and the first low-noise amplifier 35 or may be connected in a path that branches off from the path connecting the first reception filter 31 and the first low-noise amplifier 35. FIG. 3 illustrates the case where the first inductor 331 is connected in series to the first reception filter 31 and the first low-noise amplifier 35.

Note that the configuration of the first input matching circuit 33 is not limited to the configuration including only the first inductor 331, but may alternatively be a configuration including the first inductor 331 and another circuit element.

(2.8) Second Input Matching Circuit

The second input matching circuit 34 illustrated in FIG. 3 is a matching circuit that is a separate device from the first input matching circuit 33. The second input matching circuit 34 includes at least a second inductor 341. The second inductor 341 is connected to the input side of the second low-noise amplifier 36. The second input matching circuit 34 is provided between the second reception filter 32 and the second low-noise amplifier 36 in the second reception path T22. The second input matching circuit 34 provides impedance matching between the second reception filter 32 and the second low-noise amplifier 36.

The second inductor 341 may be directly connected in series to the second reception filter 32 and the second low-noise amplifier 36 or may be connected in a path that branches off from the path connecting the second reception filter 32 and the second low-noise amplifier 36. FIG. 3 illustrates the case where the second inductor 341 is connected in series to the second reception filter 32 and the second low-noise amplifier 36.

Note that the configuration of the second input matching circuit 34 is not limited to the configuration including only the second inductor 341, but may alternatively be a configuration including the second inductor 341 and another circuit element.

(2.9) First Low-noise Amplifier

The first low-noise amplifier 35 illustrated in FIG. 3 is an amplifier that amplifies the first reception signal with low noise. The first low-noise amplifier 35 is provided between the first input matching circuit 33 and the output terminal 63 in the first reception path T12. The first low-noise amplifier 35 has an input terminal and an output terminal, which are not illustrated. The input terminal of the first low-noise amplifier 35 is connected to the first input matching circuit 33. The output terminal of the first low-noise amplifier 35 is connected to an external circuit (for example, the signal processing circuit 82) via the output terminal 63. The output terminal 63 is a terminal from which a radio frequency signal (first reception signal) is output from the first low-noise amplifier 35 to the external circuit.

(2.10) Second Low-noise Amplifier

The second low-noise amplifier 36 illustrated in FIG. 3 is an amplifier that is a separate device from the first low-noise amplifier 35 and amplifies the second reception signal with low noise. The second low-noise amplifier 36 is provided between the second input matching circuit 34 and the output terminal 63 in the second reception path T22. The second low-noise amplifier 36 has an input terminal and an output terminal, which are not illustrated. The input terminal of the second low-noise amplifier 36 is connected to the second input matching circuit 34. The output terminal of the second low-noise amplifier 36 is connected to an external circuit (for example, the signal processing circuit 82) via the output terminal 63. The output terminal 63 is a terminal from which a radio frequency signal (second reception signal) is output from the second low-noise amplifier 36 to the external circuit.

(2.11) Antenna Switch

As illustrated in FIG. 3, the antenna switch 4 has a common terminal 41 and a plurality of selection terminals 42 (four in the illustrated example). The common terminal 41 is connected to the common terminal 61. Of the plurality of selection terminals 42, a selection terminal 421 is connected to the first transmission filter 22, and a selection terminal 422 is connected to the first reception filter 31. A selection terminal 423 is connected to the second transmission filter 23, and a selection terminal 424 is connected to the second reception filter 32. An antenna 81 is connected to the common terminal 61.

The antenna switch 4 switches the connection status between the common terminal 41 and the plurality of selection terminals 42. More specifically, the antenna switch 4 is controlled, for example, by the signal processing circuit 82. The antenna switch 4 electrically connects the common terminal 41 to at least one of the plurality of selection terminals 42 in accordance with a control signal from the RF signal processing circuit 83 of the signal processing circuit 82.

(3) Structure of Radio Frequency Module

Next, a structure of the radio frequency module 1 according to the embodiment is described with reference to the drawings.

As illustrated in FIG. 1 and FIG. 2, the radio frequency module 1 includes the mounting board 5, the plurality of external connection terminals 6, the first resin member 71, and the second resin member 72.

The radio frequency module 1 is electrically connectable to an external board (not illustrated). The external board corresponds to, for example, a mother board of a mobile phone, communication equipment, or the like. Note that "the radio frequency module 1 is electrically connectable to an external board" means to include not only the case where the radio frequency module 1 is directly mounted on an external board but also the case where the radio frequency module 1 is indirectly mounted on an external board. Note that "the case where the radio frequency module 1 is indirectly mounted on an external board" is the case where the radio frequency module 1 is mounted on another radio frequency module that is mounted on an external board or any other similar case.

(3.1) Mounting Board

As illustrated in FIG. 1 and FIG. 2, the mounting board 5 has a first principal surface 51 and a second principal surface 52 that are on opposite sides of the mounting board 5. The first principal surface 51 and the second principal surface 52 are on opposite sides of the mounting board 5 in a thickness direction D1 of the mounting board 5. In the case where the radio frequency module 1 is provided on an external board (not illustrated), the second principal surface 52 is the principal surface that faces the external board. The mounting board 5 is a double-sided mounting board in which circuit elements are mounted on both the first principal surface 51 and the second principal surface 52.

The mounting board 5 is a multilayer board in which a plurality of dielectric layers are stacked on top of each other. The mounting board 5 has a plurality of conductor pattern portions (not illustrated) and a plurality of penetration electrodes (only one penetration electrode 54 is illustrated). The plurality of conductor pattern portions includes a conductor pattern portion set at a ground potential. A plurality of penetration electrodes are used for electrically connecting circuit elements mounted on the first principal surface 51 and the conductor pattern portions of the mounting board 5. Further, a plurality of penetration electrodes are used for electrically connecting circuit elements mounted on the first principal surface 51 and circuit elements mounted on the second principal surface 52 and for electrically connecting the conductor pattern portions of the mounting board 5 and external connection terminals 6.

On the first principal surface 51 of the mounting board 5, the power amplifier 21, the first transmission filter 22, the second transmission filter 23, the first reception filter 31, the first inductor 331 of the first input matching circuit 33 (see FIG. 3), the second low-noise amplifier 36, and the antenna switch 4 are arranged. On the second principal surface 52 of the mounting board 5, the second reception filter 32, the second inductor 341 of the second input matching circuit 34 (see FIG. 3), and the first low-noise amplifier 35 are arranged. Furthermore, on the second principal surface 52 of the mounting board 5, a plurality of external connection terminals 6 is arranged.

(3.2) Circuit Elements for First Communication Band

As illustrated in FIG. 1 and FIG. 2, the power amplifier 21 is arranged on the first principal surface 51 side of the mounting board 5. In the example of FIG. 1 and FIG. 2, the power amplifier 21 is mounted on the first principal surface 51 of the mounting board 5. Alternatively, part of the power amplifier 21 may be mounted on the first principal surface 51 of the mounting board 5, and the remaining of the power amplifier 21 may be installed in the inside of the mounting board 5. In other words, the power amplifier 21 is arranged closer to the first principal surface 51 than the second principal surface 52 in the mounting board 5 and has at least the part that is mounted on the first principal surface 51.

As illustrated in FIG. 1, the first transmission filter 22 is arranged on the first principal surface 51 side of the mounting board 5. In the example of FIG. 1, the first transmission filter 22 is mounted on the first principal surface 51 of the mounting board 5. Alternatively, part of the first transmission filter 22 may be mounted on the first principal surface 51 of the mounting board 5, and the remaining of the first transmission filter 22 may be installed in the inside of the mounting board 5. In other words, the first transmission filter 22 is arranged closer to the first principal surface 51 than the second principal surface 52 in the mounting board 5 and has at least the part that is mounted on the first principal surface 51.

The first transmission filter 22 is, for example, an acoustic wave filter including a plurality of series arm resonators and a plurality of parallel arm resonators. The acoustic wave filter is, for example, a surface acoustic wave (SAW) filter that utilizes a surface acoustic wave. Furthermore, the first transmission filter 22 may include at least one of an inductor and a capacitor, which is connected in series to one of the plurality of series arm resonators, or may include at least one of an inductor and a capacitor, which is connected in series to one of the plurality of parallel arm resonators.

As illustrated in FIG. 1, the first reception filter 31 is arranged on the first principal surface 51 side of the mounting board 5 and is connected to the first inductor 331 of the first input matching circuit 33 (see FIG. 3). In the example of FIG. 1, the first reception filter 31 is mounted on the first principal surface 51 of the mounting board 5. Alternatively, part of the first reception filter 31 may be mounted on the first principal surface 51 of the mounting board 5, and the remaining of the first reception filter 31 may be installed in the inside of the mounting board 5. In other words, the first reception filter 31 is arranged closer to the first principal surface 51 than the second principal surface 52 in the mounting board 5 and has at least the part that is mounted on the first principal surface 51.

As is the case with the first transmission filter 22, the first reception filter 31 is, for example, an acoustic wave filter including a plurality of series arm resonators and a plurality of parallel arm resonators. The acoustic wave filter is, for example, a SAW filter that utilizes a surface acoustic wave.

Furthermore, the first reception filter 31 may include at least one of an inductor and a capacitor, which is connected in series to one of the plurality of series arm resonators, or may include at least one of an inductor and a capacitor, which is connected in series to one of the plurality of parallel arm resonators.

As illustrated in FIG. 1 and FIG. 2, the first inductor 331 of the first input matching circuit 33 is arranged on the first principal surface 51 side of the mounting board 5. The first inductor 331 is, for example, a chip-like element mounted on the first principal surface 51 of the mounting board 5 or a wiring pattern portion installed in the inside of the mounting board 5. In other words, the first inductor 331 is arranged closer to the first principal surface 51 than the second principal surface 52 in the mounting board 5 and has at least the part that is mounted on the first principal surface 51. In the example of FIG. 1 and FIG. 2, the first inductor 331 is mounted on the first principal surface 51 of the mounting board 5.

Alternatively, the first input matching circuit 33 may include a first capacitor (not illustrated) in addition to the first inductor 331. The first capacitor is, for example, a chip-like element mounted on the first principal surface 51 of the mounting board 5 or a structure including two wiring pattern portions facing each other and being installed in the inside of the mounting board 5.

As illustrated in FIG. 1 and FIG. 2, the first low-noise amplifier 35 is arranged on the second principal surface 52 side of the mounting board 5. In the example of FIG. 1 and FIG. 2, the first low-noise amplifier 35 is mounted on the second principal surface 52 of the mounting board 5. Alternatively, part of the first low-noise amplifier 35 may be mounted on the second principal surface 52 of the mounting board 5, and the remaining of the first low-noise amplifier 35 may be installed in the inside of the mounting board 5. In other words, the first low-noise amplifier 35 is arranged closer to the second principal surface 52 than the first principal surface 51 in the mounting board 5 and has at least the part that is mounted on the second principal surface 52.

(3.3) Circuit Elements for Second Communication Band

As illustrated in FIG. 1, the second transmission filter 23 is arranged on the first principal surface 51 side of the mounting board 5. In the example of FIG. 1, the second transmission filter 23 is mounted on the first principal surface 51 of the mounting board 5. Alternatively, part of the second transmission filter 23 may be mounted on the first principal surface 51 of the mounting board 5, and the remaining of the second transmission filter 23 may be installed in the inside of the mounting board 5. In other words, the second transmission filter 23 is arranged closer to the first principal surface 51 than the second principal surface 52 in the mounting board 5 and has at least the part that is mounted on the first principal surface 51.

The second transmission filter 23 is, for example, an acoustic wave filter including a plurality of series arm resonators and a plurality of parallel arm resonators. The acoustic wave filter is, for example, a SAW filter that utilizes a surface acoustic wave. Furthermore, the second transmission filter 23 may include at least one of an inductor and a capacitor, which is connected in series to one of the plurality of series arm resonators, or may include at least one of an inductor and a capacitor, which is connected in series to one of the plurality of parallel arm resonators.

As illustrated in FIG. 1, the second reception filter 32 is arranged on the second principal surface 52 side of the mounting board 5 and is connected to the second inductor 341 of the second input matching circuit 34 (see FIG. 3). In the example of FIG. 1, the second reception filter 32 is mounted on the second principal surface 52 of the mounting board 5. Alternatively, part of the second reception filter 32 may be mounted on the second principal surface 52 of the mounting board 5, and the remaining of the second reception filter 32 may be installed in the inside of the mounting board 5. In other words, the second reception filter 32 is arranged closer to the second principal surface 52 than the first principal surface 51 in the mounting board 5 and has at least the part that is mounted on the second principal surface 52.

As is the case with the second transmission filter 23, the second reception filter 32 is, for example, an acoustic wave filter including a plurality of series arm resonators and a plurality of parallel arm resonators. The acoustic wave filter is, for example, a SAW filter that utilizes a surface acoustic wave. Furthermore, the second reception filter 32 may include at least one of an inductor and a capacitor, which is connected in series to one of the plurality of series arm resonators, or may include at least one of an inductor and a capacitor, which is connected in series to one of the plurality of parallel arm resonators.

As illustrated in FIG. 1, the second inductor 341 of the second input matching circuit 34 is arranged on the second principal surface 52 side of the mounting board 5. The second inductor 341 is, for example, a chip-like element mounted on the second principal surface 52 of the mounting board 5 or a wiring pattern portion installed in the inside of the mounting board 5. In other words, the second inductor 341 is arranged closer to the second principal surface 52 than the first principal surface 51 in the mounting board 5 and has at least the part that is mounted on the second principal surface 52. In the example of FIG. 1, the second inductor 341 is mounted on the second principal surface 52 of the mounting board 5.

Alternatively, the second input matching circuit 34 may include a second capacitor (not illustrated) in addition to the second inductor 341. The second capacitor is, for example, a chip-like element mounted on the second principal surface 52 of the mounting board 5 or a structure including two wiring pattern portions facing each other and being installed in the inside of the mounting board 5.

As illustrated in FIG. 1 and FIG. 2, the second low-noise amplifier 36 is arranged on the first principal surface 51 side of the mounting board 5. In the example of FIG. 1 and FIG. 2, the second low-noise amplifier 36 is mounted on the first principal surface 51 of the mounting board 5. Alternatively, part of the second low-noise amplifier 36 may be mounted on the first principal surface 51 of the mounting board 5, and the remaining of the second low-noise amplifier 36 may be installed in the inside of the mounting board 5. In other words, the second low-noise amplifier 36 is arranged closer to the first principal surface 51 than the second principal surface 52 in the mounting board 5 and has at least the part that is mounted on the first principal surface 51.

(3.4) Antenna Switch

As illustrated in FIG. 1, the antenna switch 4 is arranged on the first principal surface 51 side of the mounting board 5. In the example of FIG. 1, the antenna switch 4 is mounted, for example, on the first principal surface 51 of the mounting board 5. Alternatively, part of the antenna switch 4 may be mounted on the first principal surface 51 of the mounting board 5, and the remaining of the antenna switch 4 may be installed in the inside of the mounting board 5. In other words, the antenna switch 4 is arranged closer to the first principal surface 51 than the second principal surface 52 in the mounting board 5 and has at least the part that is mounted on the first principal surface 51.

Alternatively, the antenna switch 4 may be arranged on the second principal surface 52 side of the mounting board 5. For example, the antenna switch 4 may be mounted on the second principal surface 52 of the mounting board 5. Alternatively, part of the antenna switch 4 may be mounted on the second principal surface 52 of the mounting board 5, and the remaining of the antenna switch 4 may be installed in the inside of the mounting board 5. In other words, the antenna switch 4 is arranged closer to the second principal surface 52 than the first principal surface 51 in the mounting board 5 and has at least the part that is mounted on the second principal surface 52.

(3.5) External Connection Terminals

A plurality of external connection terminals 6 illustrated in FIG. 1 and FIG. 2 is terminals for electrically connecting the mounting board 5 and an external board (not illustrated). The plurality of external connection terminals 6 includes the common terminal 61, the input terminal 62, and the output terminal 63 illustrated in FIG. 3 and a plurality of ground electrodes.

The plurality of external connection terminals 6 is arranged on the second principal surface 52 side of the mounting board 5. The plurality of external connection terminals 6 are column-like (for example, substantially cylindrical) electrodes provided on the second principal surface 52 of the mounting board 5. The material of the plurality of external connection terminals 6 is, for example, a metal (for example, copper, copper alloy, or the like). Each of the plurality of external connection terminals 6 has a base portion bonded to the second principal surface 52 of the mounting board 5 and a top portion arranged on the opposite side of the base portion in the thickness direction D1 of the mounting board 5. The top portion of each of the plurality of external connection terminals 6 may include, for example, a gold-plated layer.

In the radio frequency module 1, the plurality of external connection terminals 6 is provided in consideration of mounting the radio frequency module 1 on an external board (mother board), having a greater number of ground electrodes of the radio frequency module 1, and the like.

(3.6) First Resin Member and Second Resin Member

As illustrated in FIG. 2, the first resin member 71 is provided on the first principal surface 51 of the mounting board 5 and covers the circuit elements arranged on the first principal surface 51 side and the first principal surface 51. The first resin member 71 has the function of ensuring reliability of the circuit elements arranged on the first principal surface 51 side, such as mechanical strength (impact resistance), moisture resistance, and the like. That is to say, the first resin member 71 has the function of protecting the circuit elements arranged on the first principal surface 51 side.

As illustrated in FIG. 2, the second resin member 72 is provided on the second principal surface 52 of the mounting board 5 and covers the circuit elements arranged on the second principal surface 52 side and the second principal surface 52. The second resin member 72 has the function of ensuring reliability of the circuit elements arranged on the second principal surface 52 side, such as mechanical strength (impact resistance), moisture resistance, and the like. That is to say, the second resin member 72 has the function of protecting the circuit elements arranged on the second principal surface 52 side.

(3.7) Positional Relationship

As illustrated in FIG. 1 and FIG. 2, the first reception filter 31 and the first inductor 331 of the first input matching circuit 33 are arranged on the first principal surface 51 side of the mounting board 5, and the first low-noise amplifier 35 is arranged on the second principal surface 52 side of the mounting board 5. Further, the second reception filter 32 and the second inductor 341 of the second input matching circuit 34 are arranged on the second principal surface 52 side of the mounting board 5, and the second low-noise amplifier 36 is arranged on the first principal surface 51 side of the mounting board 5.

As illustrated in FIG. 1 and FIG. 2, a footprint of the first inductor 331 of the first input matching circuit 33 overlaps with a footprint of the first low-noise amplifier 35 in the plan view seen from the thickness direction D1 of the mounting board 5. In the example of FIG. 1 and FIG. 2, the whole of the footprint of the first inductor 331 overlaps with at least part of the footprint of the first low-noise amplifier 35 in the plan view seen from the thickness direction D1 of the mounting board 5. Alternatively, only part of the footprint of the first inductor 331 may overlap with at least part of the footprint of the first low-noise amplifier 35.

This enables to shorten the length of wiring between the first inductor 331 of the first input matching circuit 33 and the first low-noise amplifier 35, and thus it becomes possible to reduce the loss caused by the wiring. Further, compared with the case where the first inductor 331 of the first input matching circuit 33 and the first low-noise amplifier 35 are arranged on the same principal surface of the mounting board 5 (the first principal surface 51 or the second principal surface 52), it becomes possible to reduce the arranging area of the first inductor 331 and the first low-noise amplifier 35 in the plan view seen from the thickness direction D1 of the mounting board 5.

As illustrated in FIG. 1 and FIG. 2, a footprint of the second inductor 341 of the second input matching circuit 34 overlaps a footprint of the second low-noise amplifier 36 in the plan view seen from the thickness direction D1 of the mounting board 5. In the example of FIG. 1 and FIG. 2, the whole of the footprint of the second inductor 341 overlaps with at least part of the footprint of the second low-noise amplifier 36 in the plan view seen from the thickness direction D1 of the mounting board 5. Alternatively, only part of the footprint of the second inductor 341 may overlap with at least part of the footprint second low-noise amplifier 36.

This enables to shorten the length of wiring between the second inductor 341 of the second input matching circuit 34 and the second low-noise amplifier 36, and thus it becomes possible to reduce the loss caused by the wiring. Further, compared with the case where the second inductor 341 of the second input matching circuit 34 and the second low-noise amplifier 36 are arranged on the same principal surface of the mounting board 5 (the first principal surface 51 or the second principal surface 52), it becomes possible to reduce the arranging area of the second inductor 341 and the second low-noise amplifier 36 in the plan view seen from the thickness direction D1 of the mounting board 5.

As illustrated in FIG. 1 and FIG. 2, a footprint of the first reception filter 31 overlaps a footprint of the first low-noise amplifier 35 in the plan view seen from the thickness direction D1 of the mounting board 5. In the example of FIG. 1 and FIG. 2, the whole of the footprint of the first reception filter 31 overlaps with at least part of the footprint of the first low-noise amplifier 35 in the plan view seen from the thickness direction D1 of the mounting board 5. Alternatively, only part of the footprint of the first reception filter 31 may overlap with at least part of the footprint of the first low-noise amplifier 35.

Compared with the case where the first reception filter 31 and the first low-noise amplifier 35 are arranged on the same principal surface of the mounting board 5 (the first principal surface 51 or the second principal surface 52), this enables to reduce the arranging area of the first reception filter 31 and the first low-noise amplifier 35 in the plan view seen from the thickness direction D1 of the mounting board 5.

As illustrated in FIG. 1, a footprint of the second reception filter 32 overlaps the footprint of the second low-noise amplifier 36 in the plan view seen from the thickness direction D1 of the mounting board 5. In the example of FIG. 1, the whole of the footprint of the second reception filter 32 overlaps with at least part of the footprint of the second low-noise amplifier 36. Alternatively, only part of the footprint of the second reception filter 32 may overlap with at least part of the footprint of the second low-noise amplifier 36.

Compared with the case where the second reception filter 32 and the second low-noise amplifier 36 are arranged on the same principal surface of the mounting board 5 (the first principal surface 51 or the second principal surface 52), this enables to reduce the arranging area of the second reception filter 32 and the second low-noise amplifier 36 in the plan view seen from the thickness direction D1 of the mounting board 5.

(4) Detailed Structure of Each Constituent Element of Radio Frequency Module (4.1) Mounting Board The mounting board 5 illustrated in FIG. 1 and FIG. 2 is, for example, a printed wiring board, a low temperature co-fired ceramics (LTCC) board, or the like. In this case, the mounting board 5 is, for example, a multilayer board including a plurality of dielectric layers and a plurality of conductor pattern portions. The plurality of dielectric layers and the plurality of conductor pattern portions are stacked on top of each other in the thickness direction D1 of the mounting board 5. The plurality of conductor pattern portions are respectively formed in predetermined shapes. Each of the plurality of conductor pattern portions includes one or more conductor portions in one plane orthogonal to the thickness direction D1 of the mounting board 5. The material of each conductor pattern portion is, for example, copper.

The first principal surface 51 and the second principal surface 52 of the mounting board 5 are separated from each other in the thickness direction D1 of the mounting board 5 and cross the thickness direction D1 of the mounting board 5. Although the first principal surface 51 of the mounting board 5 is, for example, orthogonal to the thickness direction D1 of the mounting board 5, the first principal surface 51 may include, for example, a side surface of a conductor portion or the like as a surface that is not orthogonal to the thickness direction D1. Further, although the second principal surface 52 of the mounting board 5 is, for example, orthogonal to the thickness direction D1 of the mounting board 5, the second principal surface 52 may include, for example, a side surface of a conductor portion or the like as a surface that is not orthogonal to the thickness direction D1. Further, minute irregularities, depression parts, or convex parts may be formed on the first principal surface 51 and the second principal surface 52 of the mounting board 5.

(4.2) Filter

Detailed structures of the first transmission filter 22, the second transmission filter 23, the first reception filter 31, and the second reception filter 32 illustrated in FIG. 3 are now described. In the following description, the first transmission filter 22, the second transmission filter 23, the first reception filter 31, and the second reception filter 32 are referred to as the filter without distinction.

The filter is a one-chip filter. Here, in the filter, for example, each of a plurality of series arm resonators and a plurality of parallel arm resonators is made up of an acoustic wave resonator. In this case, the filter includes, for example, a substrate, a piezoelectric layer, and a plurality of interdigital transducer (IDT) electrodes. The substrate has a first surface and a second surface that are on opposite sides of the mounting board in the thickness direction of the substrate. The piezoelectric layer is provided on the first surface side of the substrate. The piezoelectric layer is provided on a low acoustic velocity film. The plurality of IDT electrodes is provided on the piezoelectric layer. Here, the low acoustic velocity film is provided on the substrate directly or indirectly. Further, the piezoelectric layer is provided on the low acoustic velocity film directly or indirectly. In the low acoustic velocity film, the acoustic velocity of a bulk wave propagating therein is lower than the acoustic velocity of a bulk wave propagating in the piezoelectric layer. In the substrate, the acoustic velocity of a bulk wave propagating therein is higher than the acoustic velocity of an acoustic wave propagating in the piezoelectric layer. The material of the piezoelectric layer is, for example, lithium tantalate. The material of the low acoustic velocity film is, for example, silicon oxide. The substrate is, for example, a silicon substrate. The thickness of the piezoelectric layer is, for example, less than or equal to $3.5\lambda$ where $\lambda 0$ is the wavelength of an acoustic wave defined by the electrode finger pitch of the IDT electrode. The thickness of the low acoustic velocity film is, for example, less than or equal to $2.0\lambda$.

The piezoelectric layer may be formed of, for example, any one of lithium tantalate, lithium niobate, zinc oxide, aluminum nitride, and lead zirconate titanate. Further, the low acoustic velocity film may include at least one kind of material selected from a group consisting of silicon oxide, glass, silicon oxynitride, tantalum oxide, and a compound prepared by adding fluorine, carbon, or boron to silicon oxide. Further, the substrate may include at least one kind of material selected from a group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

The filter further includes, for example, a spacer layer and a cover member. The spacer layer and the cover member are provided on the first surface of the substrate. The spacer layer surrounds the plurality of IDT electrodes in the plan view seen from the thickness direction of the substrate. In the plan view seen from the thickness direction of the substrate, the spacer layer has a frame-like shape (substantially rectangular frame-like shape). The spacer layer has electrical insulation property. The material of the spacer layer is, for example, synthetic resin such as epoxy resin, polyimide, or the like. The cover member has a plate-like shape. In the plan view seen from the thickness direction of the substrate, the cover member has a substantially rectangular shape. However, the shape of the cover member is not limited to a substantially rectangular shape and may alternatively be, for example, a substantially square shape. In the filter, in the plan view seen from the thickness direction of the substrate, the external size of the cover member and the external size of the spacer layer are substantially the same. The cover member is arranged on the spacer layer in such a manner as to face the substrate in the thickness direction of the substrate. The cover member overlaps the plurality of IDT electrodes in the thickness direction of the substrate and is separated from the plurality of IDT electrodes in the thickness direction of the substrate. The cover member has electrical insulation property. The material of the cover member is, for example, synthetic resin such as epoxy resin, polyimide, or the like. The filter includes space surrounded by the substrate, the spacer layer, and the cover member. In the filter, the space is filled with gas. The gas is, for example, air, an inert gas (for example, nitrogen gas), or the like. A plurality of terminals are exposed from the cover member. Each of the plurality of terminals is, for example, a bump. Each bump is, for example, a solder bump. Each bump is not limited to a solder bump and may alternatively be, for example, a gold bump.

The filter may include, for example, a close contact layer interposed between the low acoustic velocity film and the piezoelectric layer. The close contact layer is, for example, formed of resin (epoxy resin, polyimide resin). Further, the filter may include a dielectric layer in between the low acoustic velocity film and the piezoelectric layer, on the piezoelectric layer, or below the low acoustic velocity film.

Further, the filter may include, for example, a high acoustic velocity film interposed between the substrate and the low acoustic velocity film. Here, the high acoustic velocity film is provided on the substrate directly or indirectly. The low acoustic velocity film is provided on the high acoustic velocity film directly or indirectly. The piezoelectric layer is provided on the low acoustic velocity film directly or indirectly. In the high acoustic velocity film, the acoustic velocity of a bulk wave propagating therein is higher than the acoustic velocity of an acoustic wave propagating in the piezoelectric layer. In the low acoustic velocity film, the acoustic velocity of a bulk wave propagating therein is lower than the acoustic velocity of a bulk wave propagating in the piezoelectric layer.

The high acoustic velocity film is formed of any one of a piezoelectric substance such as diamond-like carbon, aluminum nitride, aluminum oxide, silicon carbide, silicon nitride, silicon, sapphire, lithium tantalate, lithium niobate, crystal, or the like, a different type of ceramic such as alumina, zirconia, cordierite, mullite, steatite, forsterite, or the like, magnesia, diamond, a material whose main component is one of the foregoing materials, and a material whose main component is a mixture of one of the foregoing materials.

With regard to the thickness of the high acoustic velocity film, because the high acoustic velocity film has the function of confining an acoustic wave in the piezoelectric layer and the low acoustic velocity film, it is desirable to have a thicker high acoustic velocity film. In addition to the high acoustic velocity film, the low acoustic velocity film, and the piezoelectric layer, the substrate may include, as another film, a close contact layer, a dielectric film, or the like.

Each of the plurality of series arm resonators and the plurality of parallel arm resonators is not limited to the acoustic wave resonator described above and may alternatively be, for example, a SAW resonator or a bulk acoustic wave (BAW) resonator. Here, the SAW resonator includes, for example, a piezoelectric substrate and an IDT electrode provided on the piezoelectric substrate. In the case where each of the plurality of series arm resonators and the plurality of parallel arm resonators is made up of a SAW resonator, the filter includes a plurality of IDT electrodes respectively corresponding to the plurality of series arm resonators and a plurality of IDT electrodes respectively corresponding to the plurality of parallel arm resonators on a single piezoelectric substrate. The piezoelectric substrate is, for example, a lithium tantalate substrate, a lithium niobate substrate, or the like.

(4.3) Antenna Switch

The antenna switch 4 illustrated in FIG. 3 is a switch IC. More specifically, the antenna switch 4 is, for example, a one-chip IC including a substrate and a switching function portion. The substrate has a first surface and a second surface that are on opposite sides of the substrate in the thickness direction of the substrate. The substrate is, for example, a silicon substrate. The switching function portion includes a field effect transistor (FET) formed on the first surface of the substrate. The switching function portion is a function portion that has the function of switching the connection status. The antenna switch 4 is flip-chip mounted on the second principal surface 52 of the mounting board 5 in such a way that the first surface of the substrate is on the second principal surface 52 side of the mounting board 5. In the plan view seen from the thickness direction D1 of the mounting board 5, the outer perimeter of the antenna switch 4 has a substantially square shape.

(4.4) Power Amplifier

The power amplifier 21 illustrated in FIG. 3 is, for example, a one-chip IC including a substrate and an amplifying function portion. The substrate has a first surface and a second surface that are on opposite sides of the substrate in the thickness direction of the substrate. The substrate is, for example, a gallium arsenide substrate. The amplifying function portion includes at least one transistor formed on the first surface of the substrate. The amplifying function portion is a function portion that has the function of amplifying a transmission signal of a predetermined frequency band. The transistor is, for example, a heterojunction bipolar transistor (HBT). In the power amplifier, a power supply voltage from a controller (not illustrated) is applied between the collector and the emitter of the HBT. In addition to the amplifying function portion, the power amplifier may include, for example, a capacitor for cutting a DC component. The power amplifier is, for example, flip-chip mounted on the first principal surface 51 of the mounting board 5 in such a way that the first surface of the substrate is on the first principal surface 51 side of the mounting board 5. In the plan view seen from the thickness direction D1 of the mounting board 5, the outer perimeter of the power amplifier has a substantially square shape.

(4.5) Low-noise Amplifier

Structures of the first low-noise amplifier 35 and the second low-noise amplifier 36 illustrated in FIG. 3 are now described in detail. In the following description, the first low-noise amplifier 35 and the second low-noise amplifier 36 are referred to as the low-noise amplifier without distinction.

The low-noise amplifier is, for example, a one-chip IC including a substrate and an amplifying function portion. The substrate has a first surface and a second surface that are on opposite sides of the substrate in the thickness direction of the substrate. The substrate is, for example, a silicon substrate. The amplifying function portion is formed on the first surface of the substrate. The amplifying function portion is a function portion that has the function of amplifying a reception signal of a predetermined frequency band. The low-noise amplifier is, for example, flip-chip mounted on the mounting board 5 in such a way that the first surface of the substrate is on the mounting board 5 side. In the plan view seen from the thickness direction D1 of the mounting board 5, the outer perimeter of the low-noise amplifier has a substantially square shape.

(5) Communication Device

As illustrated in FIG. 3, the communication device 8 includes the radio frequency module 1, the antenna 81, and the signal processing circuit 82.

The antenna 81 is connected to the common terminal 61 of the radio frequency module 1. The antenna 81 has a transmission function of radiating a first transmission signal and a second transmission signal output from the radio frequency module 1 via radio waves and a reception function of receiving a first reception signal and a second reception signal in the form of radio waves from outside and outputting received signals to the radio frequency module 1.

The signal processing circuit 82 includes the RF signal processing circuit 83 and a baseband signal processing circuit 84. The signal processing circuit 82 performs processing on the first transmission signal and the first reception signal and on the second transmission signal and the second reception signal.

The RF signal processing circuit 83 is, for example, a radio frequency integrated circuit (RFIC) and performs signal processing on a radio frequency signal.

The RF signal processing circuit 83 performs signal processing on a radio frequency signal output from the baseband signal processing circuit 84 using up-converting and the like, and outputs a radio frequency signal, on which the signal processing has been performed, to the radio frequency module 1. Specifically, the RF signal processing circuit 83 performs signal processing on a first transmission signal output from the baseband signal processing circuit 84 using up-converting and the like, and outputs a first transmission signal, on which the signal processing has been performed, to the first transmission path T11 of the radio frequency module 1. Further, the RF signal processing circuit 83 performs signal processing on a second transmission signal output from the baseband signal processing circuit 84 using up-converting and the like, and outputs a second transmission signal, on which the signal processing has been performed, to the second transmission path T21 of the radio frequency module 1.

The RF signal processing circuit 83 performs signal processing on a radio frequency signal output from the radio frequency module 1 using down-converting and the like, and outputs a radio frequency signal, on which the signal processing has been performed, to the baseband signal processing circuit 84. Specifically, the RF signal processing circuit 83 performs signal processing on the first reception signal output from the first reception path T12 of the radio frequency module 1, and outputs the first reception signal, on which the signal processing has been performed, to the baseband signal processing circuit 84. Further, the RF signal processing circuit 83 performs signal processing on the second reception signal output from the second reception path T22 of the radio frequency module 1, and outputs the second reception signal, on which the signal processing has been performed, to the baseband signal processing circuit 84.

The baseband signal processing circuit 84 is, for example, a baseband integrated circuit (BBIC) and performs predetermined signal processing on a transmission signal from outside of the signal processing circuit 82. The reception signal processed in the baseband signal processing circuit 84 is used, for example, as an image signal for image display or as an audio signal for calls.

Further, the RF signal processing circuit 83 also has the function of a control portion that controls the connection of the antenna switch 4 included in the radio frequency module 1 based on the communication band (frequency band) being used. Specifically, the RF signal processing circuit 83 switches the connection of the antenna switch 4 of the radio frequency module 1 in response to a control signal (not illustrated). Note that the control part may be provided outside the RF signal processing circuit 83, or may be provided, for example, inside the radio frequency module 1 or the baseband signal processing circuit 84.

(6) Effects

In the radio frequency module 1 according to the embodiment, the first inductor 331 of the first input matching circuit 33 is arranged on the first principal surface 51 side of the mounting board 5. Further, the first low-noise amplifier 35 is arranged on the second principal surface 52 side of the mounting board 5. Furthermore, at least part of the footprint of the first inductor 331 overlaps with at least part of the footprint of the first low-noise amplifier 35.

This enables to shorten the length of wiring between the first inductor 331 of the first input matching circuit 33 and the first low-noise amplifier 35. As a result, it becomes possible to reduce the loss caused by the wiring between the first inductor 331 and the first low-noise amplifier 35.

Furthermore, compared with the case where the first inductor 331 of the first input matching circuit 33 and the first low-noise amplifier 35 are arranged on the same principal surface of the mounting board 5, it becomes possible to reduce the arranging area of the first inductor 331 and the first low-noise amplifier 35 in the plan view seen from the thickness direction D1 of the mounting board 5. As a result, it becomes possible to reduce the size of the radio frequency module 1.

In the radio frequency module 1 according to the embodiment, at least part of the footprint of the first reception filter 31 overlaps with at least part of the footprint of the first low-noise amplifier 35 in the thickness direction D1 of the mounting board 5. Compared with the case where the first reception filter 31 and the first low-noise amplifier 35 are arranged on the same principal surface of the mounting board 5, this enables to reduce the arranging area of the first reception filter 31 and the first low-noise amplifier 35 in the plan view seen from the thickness direction D1 of the mounting board 5. As a result, it becomes possible to further reduce the size of the radio frequency module 1.

In the radio frequency module 1 according to the embodiment, the first low-noise amplifier 35 is arranged on the second principal surface 52 side of the mounting board 5, and the second low-noise amplifier 36 is arranged on the first principal surface 51 side of the mounting board 5. This enables to improve isolation between the first low-noise amplifier 35 and the second low-noise amplifier 36, and thus it becomes possible to reduce electrical interference between two communications (communication of the first communication band and communication of the second communication band). As a result, it becomes possible to suppress the decrease in reception sensitivity even in simultaneous communication using two communications (carrier aggregation, dual connectivity).

Further, in the radio frequency module 1 according to the embodiment, the second inductor 341 of the second input matching circuit 34 is arranged on the second principal surface 52 side of the mounting board 5. Further, the second low-noise amplifier 36 is arranged on the first principal surface 51 side of the mounting board 5. Furthermore, at least part of the footprint of the second inductor 341 overlaps with at least part of the footprint of the second low-noise amplifier 36.

This enables to shorten the length of wiring between the second inductor 341 of the second input matching circuit 34 and the second low-noise amplifier 36. As a result, it becomes possible to reduce the loss caused by the wiring between the second inductor 341 and the second low-noise amplifier 36.

Furthermore, compared with the case where the second inductor 341 of the second input matching circuit 34 and the second low-noise amplifier 36 are arranged on the same principal surface of the mounting board 5, it becomes possible to reduce the arranging area of the second inductor 341 and the second low-noise amplifier 36 in the plan view seen from the thickness direction D1 of the mounting board 5. As a result, it becomes possible to further reduce the size of the radio frequency module 1.

In the radio frequency module 1 according to the embodiment, the whole of the footprint of the first inductor 331 overlaps with at least part of the footprint of the first low-noise amplifier 35. This enables to reduce the arranging area of the first inductor 331 and the first low-noise amplifier 35 in the plan view seen from the thickness direction D1 of the mounting board 5, and thus it becomes possible to further reduce the size of the radio frequency module 1. Similarly, the whole of the footprint of the second inductor 341 overlaps with at least part of the footprint of the second low-noise amplifier 36. This enables to reduce the arranging area of the second inductor 341 and the second low-noise amplifier 36 in the plan view seen from the thickness direction D1 of the mounting board 5, and thus it becomes possible to further reduce the size of the radio frequency module 1.

(7) Modified Example

Next, a modified example of the embodiment is described.

As a modified example of the embodiment, a radio frequency module 1a may include a plurality of external connection terminals 6a such as the ones illustrated in FIG. 4 instead of the plurality of external connection terminals 6 (see FIG. 2).

The plurality of external connection terminals 6a are not the column-like electrodes but have bump structures. The plurality of external connection terminals 6a is arranged on the second principal surface 52 side of the mounting board 5. In the radio frequency module 1a according to the present modified example, the second resin member 72 (see FIG. 2) is omitted.

As another modified example of the embodiment, the radio frequency module 1 may include only the configuration necessary for communication of the first communication band. More specifically, the radio frequency module 1 according to the present modified example includes the power amplifier 21, the first transmission filter 22, the first reception filter 31, the first input matching circuit 33, the first low-noise amplifier 35, and the antenna switch 4. On the other hand, the radio frequency module 1 does not include the second transmission filter 23, the switch 24, the second reception filter 32, and the second low-noise amplifier 36.

In the radio frequency module 1 according to the present modified example, the first reception filter 31 is arranged on the first principal surface 51 side of the mounting board 5. Because the first reception filter 31 is not arranged on the second principal surface 52 side of the mounting board 5, in the case where the substrate of the first low-noise amplifier 35 is a silicon substrate, the substrate of the first low-noise amplifier 35 can be easily ground down. As a result, in the radio frequency module 1, it becomes possible to reduce the height of the mounting board 5 on the second principal surface 52 side.

In the embodiment, the first transmission filter 22 and the second transmission filter 23 are, for example, surface acoustic wave filters. However, in another modified example of the embodiment, the first transmission filter 22 and the second transmission filter 23 are not limited to the surface acoustic wave filters and may alternatively be filters other than the surface acoustic wave filters. The first transmission filter 22 and the second transmission filter 23 may each be, for example, any one of an acoustic wave filter using a bulk acoustic wave (BAW), a LC resonance filter, and a dielectric filter.

The radio frequency module according to each of the modified examples described above also produces the effects substantially similar to those of the radio frequency module 1 according to the embodiment.

In the present disclosure, "an arbitrary constituent element is arranged on a first principal surface side of a mounting board" means that in a mounting board having a first principal surface and a second principal surface that are on opposite sides of the mounting board, the constituent element is arranged closer to the first principal surface than the second principal surface of the mounting board. Examples of the case where "an arbitrary constituent element is arranged on a first principal surface side of a mounting board" include the case where the constituent element is arranged on the first principal surface of the mounting board and the case where the constituent element is arranged in such a manner as to be separated from the first principal surface of the mounting board. Examples of the case where "the constituent element is arranged on the first principal surface of the mounting board" include the case where the constituent element is mounted on the first principal surface of the mounting board and the case where part of the constituent element is mounted on the first principal surface of the mounting board and the remaining of the constituent element is installed in the inside of the mounting board. Examples of the case where "the constituent element is arranged in such a manner as to be separated from the first principal surface of the mounting board" include the case where the constituent element and another constituent element are stacked on top of each other. In this case, another constituent element is mounted on the first principal surface of the mounting board, and the constituent element is stacked on another constituent element. Still another constituent element may be present between the constituent element and another constituent element.

Similarly, in the present disclosure, "an arbitrary constituent element is arranged on a second principal surface side of a mounting board" means that in a mounting board having a first principal surface and a second principal surface that are on opposite sides of the mounting board, the constituent element is arranged closer to the second principal surface than the first principal surface of the mounting board. Examples of the case where "an arbitrary constituent element is arranged on a second principal surface side of a mounting board" include the case where the constituent element is arranged on the second principal surface of the mounting board and the case where the constituent element is arranged in such a manner as to be separated from the second principal surface of the mounting board. Examples of the case where "the constituent element is arranged on the second principal surface of the mounting board" include the case where the constituent element is mounted on the second principal surface of the mounting board and the case where part of the constituent element is mounted on the second principal surface of the mounting board and the remaining of the constituent element is installed in the inside of the mounting board. Examples of the case where "the constituent element is arranged in such a manner as to be separated from the second principal surface of the mounting board" include the case where the constituent element and another constituent element are stacked on top of each other. In this case, another constituent element is mounted on the second principal surface of the mounting board, and the constituent element is stacked on another constituent element. Still another constituent element may be present between the constituent element and another constituent element.

The embodiment and the modified examples described above are only part of various embodiments and modified examples of the present disclosure. Further, the embodiment and the modified example may be modified in various ways according to the design and the like, provided that the object of the present disclosure is achieved.

Aspects

In the present specification, the following aspects are disclosed.

A radio frequency module (1;1a) according to a first aspect includes a mounting board (5), a low-noise amplifier (first low-noise amplifier 35), and an input matching circuit (first input matching circuit 33). The mounting board (5) has a first principal surface (51) and a second principal surface (52). The first principal surface (51) and the second principal surface (52) are on opposite sides of the mounting board (5). The low-noise amplifier amplifies a reception signal (first reception signal). The input matching circuit includes an inductor (first inductor 331). The inductor is connected to an input side of the low-noise amplifier. The inductor is arranged on a first principal surface (51) side of the mounting board (5). The low-noise amplifier is arranged on a second principal surface (52) side of the mounting board (5). In a plan view seen from a thickness direction (D1) of the mounting board (5), at least part of the footprint of the inductor overlaps with at least part of the footprint of the low-noise amplifier.

According to the radio frequency module (1;1a) according to the first aspect, it becomes possible to shorten the length of wiring between the inductor (first inductor 331) of the input matching circuit (first input matching circuit 33) and the low-noise amplifier (first low-noise amplifier 35). This enables to reduce loss caused by the wiring.

Furthermore, compared with the case where the inductor (first inductor 331) of the input matching circuit (first input matching circuit 33) and the low-noise amplifier (first low-noise amplifier 35) are arranged on the same principal surface of the mounting board (5), the radio frequency module (1;1a) according to the first aspect enables to reduce the arranging area of the inductor and the low-noise amplifier in the plan view seen from the thickness direction (D1) of the mounting board (5). As a result, it becomes possible to reduce the size of the radio frequency module (1;1a).

A radio frequency module (1;1a) according to a second aspect further includes a plurality of external connection terminals (6;6a) in the first aspect. The plurality of external connection terminals (6;6a) is arranged on the second principal surface (52) side of the mounting board (5).

A radio frequency module (1;1a) according to a third aspect further includes a reception filter (first reception filter 31) in the first or second aspect. The reception filter allows a reception signal (first reception signal) to pass. The reception filter is arranged on the first principal surface (51) side of the mounting board (5) and is connected to the inductor (first inductor 331).

In a radio frequency module (1;1a) according to a fourth aspect, at least part of the footprint of the reception filter (first reception filter 31) overlaps with at least part of the footprint of the low-noise amplifier (first low-noise amplifier 35) in the thickness direction (D1) of the mounting board (5) in the third aspect.

Compared with the case where the reception filter (first reception filter 31) and the low-noise amplifier (first low-noise amplifier 35) are arranged on the same principal surface of the mounting board (5), the radio frequency module (1;1a) according to the fourth aspect enables to reduce the arranging area of the reception filter and the low-noise amplifier in the plan view seen from the thickness direction (D1) of the mounting board (5). As a result, it becomes possible to further reduce the size of the radio frequency module (1;1a).

A radio frequency module (1;1a) according to a fifth aspect further includes a second low-noise amplifier (36) and a second input matching circuit (34) in any one of the first to fourth aspects. The second low-noise amplifier (36) is a separate device from the first low-noise amplifier (35), which is the low-noise amplifier. The second input matching circuit (34) is a separate device from the first input matching circuit (33) that is the input matching circuit. The second input matching circuit (34) includes a second inductor (341). The second inductor (341) is connected to an input side of the second low-noise amplifier (36). The second inductor (341) is arranged on the second principal surface (52) side of the mounting board (5). The second low-noise amplifier (36) is arranged on the first principal surface (51) side of the mounting board (5). In the thickness direction (D1) of the mounting board (5), at least part of the footprint of the second inductor (341) overlaps with at least part of the footprint of the second low-noise amplifier (36).

The radio frequency module (1;1a) according to the fifth aspect enables to improve isolation between the first low-noise amplifier (35) and the second low-noise amplifier (36), and thus it becomes possible to reduce electrical interference between two communications. As a result, it becomes possible to suppress a decrease in reception sensitivity even in carrier aggregation.

Further, the radio frequency module (1;1a) according to the fifth aspect enables to shorten the length of wiring between the second inductor (341) of the second input matching circuit (34) and the second low-noise amplifier (36). As a result, it becomes possible to reduce loss caused by the wiring between the second inductor (341) and the second low-noise amplifier (36).

Furthermore, compared with the case where the second inductor (341) of the second input matching circuit (34) and the second low-noise amplifier (36) are arranged on the same principal surface of the mounting board (5), the radio frequency module (1;1a) according to the fifth aspect enables to reduce the arranging area of the second inductor (341) and the second low-noise amplifier (36) in the plan view seen from the thickness direction (D1) of the mounting board (5). As a result, it becomes possible to further reduce the size of the radio frequency module (1).

In a radio frequency module (1;1a) according to a sixth aspect, a whole of the footprint of the inductor (first inductor 331) overlaps with at least part of the footprint of the low-noise amplifier (first low-noise amplifier 35) in the plan view seen from the thickness direction (D1) of the mounting board (5) in any one of the first to fifth aspects.

The radio frequency module (1;1a) according to the sixth aspect enables to reduce the arranging area of the inductor (first inductor 331) and the low-noise amplifier (first low-noise amplifier 35) in the plan view seen from the thickness direction (D1) of the mounting board (5). As a result, it becomes possible to further reduce the size of the radio frequency module (1;1a).

A communication device (8) according to a seventh aspect includes the radio frequency module (1;1a) according to any one of the first to sixth aspects and a signal processing circuit (82). The signal processing circuit (82) performs processing on a reception signal.

According to the communication device (8) according to the seventh aspect, in the radio frequency module (1;1a), it becomes possible to shorten the length of wiring between the inductor (first inductor 331) of the input matching circuit (first input matching circuit 33) and the low-noise amplifier (first low-noise amplifier 35). As a result, it becomes possible to reduce loss caused by the wiring.

Furthermore, compared with the case where the inductor (first inductor 331) of the input matching circuit (first input matching circuit 33) and the low-noise amplifier (first low-noise amplifier 35) are arranged on the same principal surface of the mounting board (5), the communication device (8) according to the seventh aspect enables to reduce the arranging area of the inductor and the low-noise amplifier in the plan view seen from the thickness direction (D1) of the mounting board (5) in the radio frequency module (1;1a). As a result, it becomes possible to reduce the size of the radio frequency module (1;1a).

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency module comprising:
  a mounting board having a first principal surface and a second principal surface on opposite sides of the mounting board;
  a first low-noise amplifier arranged on the second principal surface and configured to amplify a first reception signal; and
  a first input matching circuit including a first inductor that is arranged on the first principal surface and connected to an input side of the first low-noise amplifier, wherein
  in a plan view seen from a thickness direction of the mounting board, at least part of a footprint the first inductor overlaps with at least part of a footprint of the first low-noise amplifier.

2. The radio frequency module of claim 1, further comprising:
  a plurality of external connection terminals arranged on the second principal surface side of the mounting board.

3. The radio frequency module of claim 1, further comprising:
  a reception filter that is arranged on the first principal surface and is connected to the first inductor and allows the first reception signal to pass.

4. The radio frequency module of claim 3, wherein
  in the plan view seen from the thickness direction of the mounting board, at least part of a footprint of the first reception filter overlaps with at least part of the footprint of the first low-noise amplifier.

5. The radio frequency module of claim 1, further comprising:
a second low-noise amplifier arranged on the first principal surface and configured to amplify a second reception signal.

6. The radio frequency module of claim 5, further comprising:
a second input matching circuit including a second inductor that is arranged on the second principal surface and connected to an input side of the second low-noise amplifier.

7. The radio frequency module of claim 6, wherein
in the plan view seen from the thickness direction of the mounting board, at least part of a footprint of the second inductor overlaps with at least part of a footprint of the second low-noise amplifier.

8. The radio frequency module of claim 7, further comprising:
a reception filter that is arranged on the second principal surface and is connected to the second inductor and allows the second reception signal to pass.

9. The radio frequency module of claim 8, wherein
in the plan view seen from the thickness direction of the mounting board, at least part of a footprint of the second reception filter overlaps with at least part of the footprint of the second low-noise amplifier.

10. The radio frequency module of claim 7, wherein
in the plan view seen from the thickness direction of the mounting board, a whole of the footprint of the second inductor overlaps with at least part of the footprint of the second low-noise amplifier.

11. The radio frequency module of claim 6, further comprising:
an electrode disposed in the mounting board that connects the second inductor to the second low-noise amplifier.

12. The radio frequency module of claim 1, wherein
in the plan view seen from the thickness direction of the mounting board, a whole of the footprint of the first inductor overlaps with at least part of the footprint of the first low-noise amplifier.

13. The radio frequency module of claim 1, further comprising:
a power amplifier arranged on the first principal surface and configured to amplify a transmission signal.

14. The radio frequency module of claim 13, further comprising:
a first transmission filter that is arranged on the first principal surface and is connected to an output side of the power amplifier via a switch.

15. The radio frequency module of claim 14, further comprising:
a second transmission filter that is arranged on the first principal surface and is connected to the output side of the power amplifier via the switch.

16. The radio frequency module of claim 1, further comprising:
an electrode disposed in the mounting board that connects the first inductor to the second low-noise amplifier.

17. The radio frequency module of claim 1, further comprising:
a resin member configured to cover circuit components arranged on the first principal surface of the mounting substrate.

18. The radio frequency module of claim 1, further comprising:
a resin member configured to cover circuit components arranged on the second principal surface of the mounting substrate.

19. A communication device comprising:
the radio frequency module including
a mounting board having a first principal surface and a second principal surface on opposite sides of the mounting board;
a first low-noise amplifier arranged on the second principal surface and configured to amplify a first reception signal; and
a first input matching circuit including a first inductor that is arranged on the first principal surface and connected to an input side of the first low-noise amplifier, wherein
in a plan view seen from a thickness direction of the mounting board, at least part of a footprint the first inductor overlaps with at least part of a footprint of the first low-noise amplifier; and
a signal processing circuit that performs processing on the reception signal.

20. A radio frequency module comprising:
a mounting board having a first principal surface and a second principal surface on opposite sides of the mounting board;
a first low-noise amplifier arranged on the second principal surface;
a second low-noise amplifier arranged on the first principal surface;
a first inductor arranged on the first principal surface and connected to an input side of the first low-noise amplifier; and
a second inductor arranged on the second principal surface and connected to an input side of the second low-noise amplifier, wherein
in a plan view seen from a thickness direction of the mounting board, at least part of a footprint the first inductor overlaps with at least part of a footprint of the first low-noise amplifier, and
in the plan view seen from the thickness direction of the mounting board, at least part of a footprint the second inductor overlaps with at least part of a footprint of the second low-noise amplifier.

* * * * *